Figure 1:
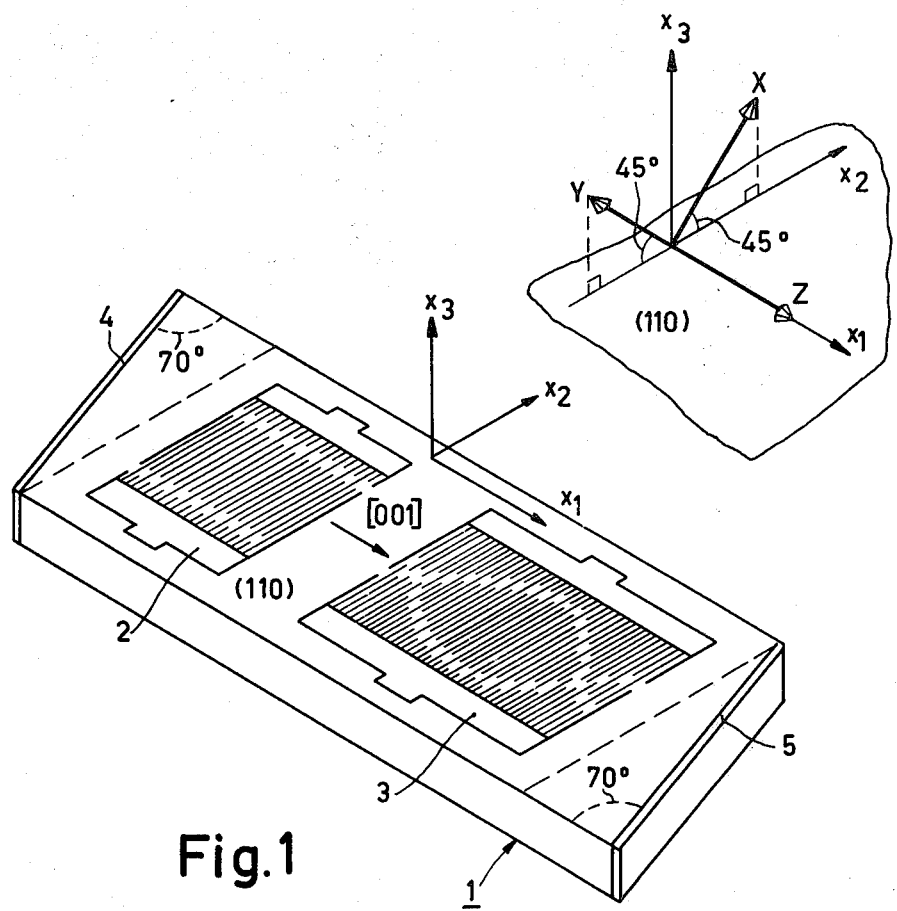

United States Patent [19]

Mitchell et al.

[11] 3,983,515

[45] Sept. 28, 1976

[54] ACOUSTIC SURFACE WAVE DEVICES

[75] Inventors: Richard Frank Mitchell, Kingston; Eileen Read, High Wycombe; Richard Stevens, Copthorne, all of England

[73] Assignee: U.S. Philips Corporation, New York, N.Y.

[22] Filed: Oct. 10, 1974

[21] Appl. No.: 513,701

[30] Foreign Application Priority Data

Oct. 12, 1973 United Kingdom............... 47743/73
Oct. 12, 1973 United Kingdom............... 47744/73

[52] U.S. Cl............................. 333/30 R; 29/25.35; 310/9.4; 310/9.5; 333/72
[51] Int. Cl.²..................... H03H 9/26; H03H 9/30; H03H 9/32; H01L 41/18
[58] Field of Search.............. 333/30 R, 72; 310/8.2, 310/9.5, 9.8; 29/25.35

[56] References Cited
UNITED STATES PATENTS 3,387,233  6/1968  Parker, Jr. ........................ 333/30 R

OTHER PUBLICATIONS de Klerk – "Ultrasonic Transducers 3. Surface Wave Transducers," in Ultrasonics, Jan. 1971; pp. 35–38.

*Primary Examiner*—Archie R. Borchelt
*Assistant Examiner*—Marvin Nussbaum
*Attorney, Agent, or Firm*—Frank R. Trifari; Bernard Franzblau

[57] ABSTRACT

An acoustic surface wave device comprising a monocrystalline body of piezoelectric material having a launching and receiving transducer applied to a planar ASW propagation surface. The piezoelectric material and the orientation of the propagation surface and the axial propagation direction relative to the crystal axes are selected to provide zero piezoelectric coupling between the transducers and a longitudinal axial bulk wave and that one of the two shear axial bulk waves that has substantially no component of particle motion perpendicular to said propagation surface. A method of manufacturing the aforesaid ASW device is also disclosed.

17 Claims, 11 Drawing Figures

ACOUSTIC SURFACE WAVE DEVICES

The invention relates to improvements in or relating to acoustic surface-wave band-pass filters and/or delay devices employing acoustic surface waves of the kind in which the wave amplitude decreases rapidly with the distance from the propagation surface, such as for example Rayleigh waves or generalised Rayleigh waves.

The use of acoustic surface waves has made it possible to manufacture frequency-selective filters and/or delay devices in a form which is small and robust, using techniques which are similar to, and compatible with, integrated circuit manufacture. Such devices make it possible to avoid difficulties such as the bulk and manufacturing costs associated with the provision of discrete inductors.

In such a device, an acoustic surface wave is launched on a planar acoustic surface-wave propagation surface of a piezoelectric body by means of an interdigital electrode array which forms a launching transducer. A further interdigital electrode array is arranged in the path of acoustic surface waves propagating from the launching transducer and forms a receiving transducer which converts the received acoustic surface wave back into a corresponding electrical signal. The interdigital arrays each have a periodic structure which, in conjunction with the acoustic surface-wave propagation velocity, give rise to a frequency-selective overall response for the device. This response can be tailored by suitably arranging the spacing, width and amount of overlap of adjacent electrode elements in the array to provide any of a large variety of desired band-pass responses.

However, the electrical field distribution in an interdigital electrode array is such that, in addition to the desired acoustic surface wave, there can also be produced undesired bulk waves in longitudinal and shear modes which propagate through the body at velocities which differ in general from the acoustic surface-wave velocity and can be received by the receiving transducer to give rise to a corresponding undesired output signal. In the design of an intermediate frequency filter for use in a television broadcast receiver, very stringent standards of signal rejection are demanded for frequencies adjacent and just above the pass-band and it is in and near this region that corresponding bulk waves tend to be excited by the interdigital transducers at frequencies which depend on the propagation velocity of the bulk wave concerned. In the case of a device whose primary purpose is to provide a time delay the presence of such bulk waves can give rise to undesired signals having the wrong delay. Bulk waves can be emitted by an interdigital transducer at varying angles to the surface-wave propagation surface and those directed towards the opposite surface of the wafer can be absorbed and/or scattered by suitable means. It has been found, however, that, even when this has been effectively carried out, a significant unpredictable undesired component can be present in the filter output.

It is an object of the invention to provide an improved acoustic surface wave device which can reduce or overcome this difficulty.

According to the invention there is provided a method of manufacturing an acoustic surface wave device in which a monocrystalline body of a selected piezoelectric substance is formed with an acoustic surface wave propagation surface, as herein defined, oriented in a selected manner with respect to the crystallographic axes of said monocrystal. Launching and receiving interdigital electrode arrays are applied to said acoustic surface wave propagation surface respectively to launch and to receive acoustic surface waves along a selected acoustic surface wave propagation axis on said surface so as to provide a desired amplitude-frequency response. The body is provided with means arranged to scatter and/or absorb bulk waves propagating in said body along paths which are not parallel to and adjacent the acoustic surface wave propagation path. The piezoelectric substance and the orientation of said respective acoustic surface wave propagation surface and axial direction relative to the crystallographic axes of said monocrystalline body are selected to provide substantially zero piezoelectric coupling between said interdigital electrode arrays and at least one of the group of axial-bulk-waves as herein defined. Said group of axial bulk waves consists of the longitudinal axial-bulk-wave and one of the two shear axial-bulk-waves when said shear axial-bulk-wave has substantially no component of particle motion at right angles to said acoustic surface wave propagation surface. The shear axial-bulk-wave or each of the shear axial-bulk-waves for which there is a significant amount of piezoelectric coupling to said interdigital electrode arrays has a particle motion containing a component perpendicular to the acoustic surface wave propagation surface so that the respective shear axial-bulk-wave is substantially unable to propagate in a direction parallel to the surface. The piezolectric coupling between a respective interdigital electrode array and the axial-bulk-waves which are generated thereby is small enough to prevent a significant disturbance of the desired amplitude-frequency response of the device.

The invention is limited herein to devices employing acoustic surface waves of the kind wherein the displacement amplitude diminishes rapidly with distance from the acoustic surface wave propagation surface into the body on which the surface is formed, such as, for example, Rayleigh waves or generalised Rayleigh waves.

An acoustic surface wave propagation surface is herein defined as a substantially planar surface formed on a body of piezoelectric monocrystalline material at a predetermined orientation to the crystallographic axes such that when an interdigital electrode array is formed on said planar surface to transmit or receive an acoustic surface wave travelling in a predetermined propagation direction over said surface, a useful degree of electro-mechanical coupling exists between said interdigital electrode array and said piezoelectric body in respect of said acoustic surface wave. For the purposes of description the acoustic surface wave propagation surface will be defined by the $x_1, x_2$ directions of an arbitrary orthogonal set of axes $x_1, x_2, x_3$, and the direction of the acoustic surface wave propagation path on said surface will be assumed to be parallel to the $x_1$ axis.

The terms axial-bulk-waves, longitudinal axial-bulk-waves and shear axial-bulk-waves are employed herein to mean respectively bulk waves, a longitudinal bulk wave and the shear bulk waves which under favourable piezoelectric coupling conditions would tend to be generated in a direction parallel to the acoustic surface wave propagation axis by an interdigital transducer electrode array at respective frequencies which depend on the spatial periodicity of the interdigital array and the corresponding wave velocity. In general, bulk waves in a monocrystalline body comprise a longitudinal bulk wave with a particle motion directed generally along the propagation direction, and two shear bulk waves having particle motions directed generally transverse to the propagation direction and at right angles to one another.

The longitudinal axial-bulk-wave, once generated, will propagate freely parallel and adjacent to the surface. In the case of the shear axial-bulk-waves however, when conditions are favourable for a wave of a certain frequency to be generated in a direction parallel to the acoustic surface wave propagation axis, such a shear bulk wave will only propagate freely parallel and adjacent to the surface if the particle motion thereof contains substantially no component perpendicular to the surface. If the shear bulk wave has a significant component of motion perpendicular to the surface, the boundary conditions at the surface will cause such a wave to become evanescent, the amplitude tending to fall away with an increase in the distance from the launching transducer.

The present invention is restricted to orientations for which the two shear axial-bulk-waves propagate at significantly different velocities, because when the propagation velocity is the same for the two shear bulk waves, a resultant shear wave is set up with a direction of particle motion which can become uncertain as a result of random changes in the relative phase of the two generated waves.

Further, in accordance with the invention, there is provided an acoustic surface wave device comprising a monocrystalline body of a piezoelectric substance having an acoustic surface wave propagation surface, as herein defined, formed thereon, and respective launching and receiving interdigital electrode arrays applied thereto respectively to launch and to receive acoustic surface waves along a predetermined propagation axis on said surface so as to provide a desired amplitude-frequency response. The body is arranged so that bulk waves directed away from said acoustic surface wave propagation surface are scattered and/or absorbed. The piezoelectric substance and the orientation of said respective acoustic surface wave propagation surface and axial direction relative to the crystallographic axes of said monocrystalline body are selected to provide substantially zero piezoelectric coupling between said interdigital electrode arrays and at least one of the group of axial-bulk-waves as herein defined, said groups consisting of the longitudinal axial-bulk-wave and that one of the two shear axial-bulk-waves which has substantially no component of particle motion at right angles to said acoustic surface wave propagation surface. Each of the shear axial-bulk-waves for which there is a significant amount of piezoelectric coupling to said interdigital electrode arrays has a particle motion containing a component perpendicular to the acoustic surface wave propagation surface so that the respective shear axial-bulk-wave is substantially unable to propagate in a direction parallel to the surface. The piezoelectric coupling between a respective interdigital electrode array and the axial-bulk-waves which are generated thereby being small enough to prevent a significant disturbance of the desired amplitude-frequency response of the device.

In one form of the invention the monocrystalline body of piezoelectric substance is selected and cut so that the following relationships are satisfied:

$$d_{11} + \tfrac{1}{2} d_{16} \tan \phi = 0 \tag{1}$$

$$d_{31} + \tfrac{1}{2} d_{36} \tan \phi = 0,$$

where $\phi$ is the angle, measured in the propagation plane $x_1, x_2$, that the particle motion of said longitudinal axial-bulk-wave, if generated, would make with the direction $x_1$, and $d_{11}$, $d_{31}$, $d_{16}$ and $d_{36}$ are respective piezoelectric constants which relate to the surface $x_1, x_2$, using the reduced indices described for example on pages 113–115 of "Physical Properties of Crystals" by J. F. Nye, 1st edition, 1957 (Oxford University Press).

In an embodiment of this form of the invention in which both of said shear axial-bulk-waves are generated by said interdigital electrode array, the crystallographic orientation is arranged so that the direction of particle movement for each shear axial-bulk-wave is inclined at least 5° to the acoustic surface wave propagation surface, and the receiving transducer is spaced from the launching transducer in the direction of propagation of acoustic surface waves so that the effect at said receiving transducer of said shear axial-bulk-waves generated by said launching transducer are made negligible compared with that of the desired acoustic surface waves. A monocrystalline body formed of lithium niobate, bismuth silicon oxide or bismuth germanium oxide can be employed in this embodiment.

As an alternative to or in combination with the first form of the invention, the piezolectric substance and the orientation relative to the crystal axes thereof of the acoustic surface wave propagation plane $x_1 x_2$ and the acoustic surface wave propagation direction $x_1$, can sometimes be selected so that the particle motion of one of said shear axial-bulk-waves is substantially parallel to said acoustic surface wave propagation surface and the piezoelectric coupling between said shear axial-bulk-wave and an interdigital transducer is zero. In the case in which the particle motion in the shear wave is at right angles to the acoustic surface wave propagation direction $x_1$, i.e. equivalent to the case when $\phi = 0$ for the longitudinal wave, the coupling is zero when $d_{16}$ and $d_{36}$ are zero. Corresponding relationships can be derived for the case in which the particle motion of the shear wave is not at right angles to the $x_1$ direction.

Orientations can be found for which one of the shear axial-bulk-waves has a particle motion parallel to the surface $x_1 x_2$ and the piezoelectric couplings between an interdigital transducer electrode array and both the longitudinal axial-bulk-wave and the said shear axial-bulk-wave are zero so that such waves are neither generated nor received thereby. Substances for which this is possible include certain piezolectric monocrystals belonging to the crystal classes 23 or $\overline{4}3m$, such as for example bismuth silicon oxide and bismuth germanium oxide. Thus said piezolectric substance can be a piezolectric cubic crystal oriented so that the acoustic surface wave propagation surface lies parallel to the (110) lattice plane or a crystallographically equivalent plane, as herein defined, and said propagation direction is oriented parallel to the [001] direction or to a corresponding equivalent direction in a crystallographically equivalent plane. Thus symmetry considerations indicate that for a cubic crystal the (110) plane is equivalent not only to the lattice planes $(1\overline{1}0)$, $(\overline{1}\overline{1}0)$ and $(\overline{1}10)$, but, because the crystal axes XYZ are interchangeable, also to the planes (101) or (011) and corresponding negative permutations. Similarly the [001] direction in the (110) plane will have corresponding equivalents in the other planes.

It can sometimes be convenient to select an orientation for which one of the two shear axial-bulk-waves has a particle motion parallel to the surface $x_1$, $x_2$ and zero piezoelectric coupling to an interdigital transducer electrode array but for which the longitudinal axial-bulk-wave is generated with a relatively small amplitude compared with that of the acoustic surface wave. This can be of advantage when such an orientation provides a relatively large coupling factor for the generation of acoustic surface waves. Such an orientation is provided in a piezoelectric cubic crystal arranged so that the acoustic surface wave propagation surface lies parallel to the (100) lattice plane, or a crystallographically-equivalent plane, and the acoustic surface wave propagation direction is parallel to the $[0\bar{1}1]$ or $[011]$ direction or to a corresponding equivalent direction in a crystallographically equivalent plane. Symmetry considerations concerning cubic crystals indicate that these directions in the (100) plane can be taken to be equivalent to the following:

| the | $[0\bar{1}1]$ | or | $[01\bar{1}]$ | directions in the | $(\bar{1}00)$ plane |
|---|---|---|---|---|---|
| | $[\bar{1}01]$ | | $[\bar{1}0\bar{1}]$ | | (010) |
| | [101] | | $[10\bar{1}]$ | | $(0\bar{1}0)$ |
| | [110] | | $[\bar{1}\bar{1}0]$ | | (001) |
| | $[\bar{1}10]$ | | $[1\bar{1}0]$ | | $(00\bar{1})$ |

Bismuth silicon oxide and bismuth germanium oxide form suitable piezoelectric cubic crystals.

This orientation has an advantage in that the shear axial-bulk-wave whose particle motion is parallel to the acoustic surface wave propagation surface has the lowest propagation velocity of the three possible axial-bulk-waves, and would, if present, cause a disturbance to the amplitude-frequency response in a region nearest to the pass-band of a band-pass filter where, for example in a colour television intermediate frequency filter, a large amount of attenuation is required.

In this orientation some coupling does exist between an interdigital electrode array and both the longitudinal axial-bulk-wave and the shear axial-bulk-wave whose particle motion is perpendicular to the propagation surface, but although the piezoelectric coupling conditions and the configurations of the interdigital electrode array are such that a shear axial-bulk-wave could be generated, a wave with such a particle motion would be substantially unable to propagate along a path adjacent and parallel to the surface. The wave would be evanescent and by suitably spacing the launching and receiving transducers, the received amplitude can be made negligible compared with the desired acoustic surface wave signal amplitude. The orientation embodied in this embodiment of the invention provides a piezoelectric coupling factor ($k^2$) for acoustic surface waves which in the case of bismuth silicon oxide, for example, is large enough compared with the magnitude of the corresponding piezoelectric constant which couples the transducer field to the longitudinal axial-bulk-wave to make the magnitude of the undesired output signal resulting from the longitudinal axial-bulk-wave small enough to permit a satisfactory television intermediate frequency filter to be manufactured.

While acoustic surface wave devices embodying the invention can be employed as delay lines with advantage, it is of especial advantage when the invention is embodied in an acoustic surface wave filter since this enables a closer realisation of the designed filter response of the acoustic wave filter to be obtained.

The invention depends on the realisation that while spurious responses in an acoustic surface wave filter or delay device resulting from bulk waves travelling away from the acoustic surface wave propagation surface can, in general, be attenuated or eliminated by absorption and/or scattering within, or at a boundary of, the propagation medium other than the acoustic surface wave propagation surface, for example by the means described and claimed in our co-pending U.S. Pat. application Ser. No. 501,482, filed Aug. 29, 1974, the significant spurious responses which nevertheless remain are due to longitudinal bulk waves, and shear bulk waves, especially when the latter have a transverse particle motion parallel to the propagation surface, which are generated in a direction parallel to the acoustic surface wave propagation axis and adjacent to the propagation surface, and that the effect of these axial-bulk-waves can be reduced or eliminated by employing a piezoelectric monocrystalline material in which an acoustic surface wave propagation surface can be and is formed for which the combination of piezoelectric coupling factors and propagation conditions in the selected acoustic surface wave propagation direction substantially prevent the transmission of energy from the interdigital transmitting electrode array to the corresponding interdigital receiving electrode array via the said longitudinal and/or the shear axial-bulk-wave component which has a particle motion lying in or nearest to a lateral direction parallel to the acoustic surface wave propagation surface.

The effect of the longitudinal axial-bulk-wave component of the spurious wave disturbance directed along the acoustic surface wave propagation direction is substantially removed by preventing this bulk wave from being generated. The piezoelectric modulii $d_{ij}$ which principally cause a longitudinal axial-bulk-wave to be propagated along the acoustic surface wave propagation path ($x_1$) when an interdigital launching transducer is employed and the particle motion is directed parallel to said path, are the modulii $d_{11}$ and $d_{31}$. In general, however, the nature of the crystal lattice and the orientation of the crystallographic axes X, Y and Z with respect to the propagation axes $x_1$, $x_2$, $x_3$, will result in a particle motion which is inclined at an angle $\phi$ to the $x_1$ direction as a result of an electric field acting by way of the respective modulii $d_{11}$ and $d_{31}$.

In order to reduce the resultant particle motion along the acoustic surface wave propagation direction to zero when the angle $\phi$ is zero, it is sufficient to select a material and a crystallographic orientation in that material for which $d_{11}$ and $d_{31}$ are zero for the acoustic surface wave propagation surface ($x_1 x_2$). As will be described hereinafter this condition is true for cubic piezoelectric crystals of Class 23 such as bismuth silicon oxide and bismuth germanium oxide and those of Class 43$m$ for certain directions of symmetry some of which can be employed in the invention.

When the angle $\phi$ is not zero, the condition for the null generation of a longitudinal bulk wave directed along the acoustic surface wave propagation direction is as hereinbefore given in the expression (1), namely $$d_{11} + \tfrac{1}{2}d_{16} \tan \phi = 0$$

$$d_{31} + \tfrac{1}{2}d_{36} \tan \phi = 0.$$

The effect of the shear axial-bulk-wave components of the spurious wave disturbance directed along the acoustic surface wave propagation direction may be substantially removed in either of two ways.

In some piezoelectric crystalline materials, such as those belonging to the aforementioned cubic classes, orientations of the acoustic surface wave propagation directions with reference to the crystallographic axes can be selected for which the shear axial-bulk-waves capable of being directed by an interdigital transducer in a direction parallel to the acoustic surface wave propagation direction, have particle motions which are respectively parallel and perpendicular to the propagation surface, and there is a zero effective piezoelectric coupling between the interdigital electrode array and the said shear axial-bulk-wave which has a particle motion parallel to the propagation surface $x_1 x_2$, and which would, if generated, propagate along the propagation axis $x_1$. When the particle motion of this shear wave is also perpendicular to the propagation axis $x_1$, a condition equivalent to the case wherein $\phi = 0$, this criterion is fulfilled when the piezoelectric modulii $d_{16}$ and $d_{36}$ are substantially zero. In the case, for example, of a piezoelectric cubic monocrystal belonging to the cubic classes 23 and $\overline{43}$ $m$, it is possible to select an orientation for which the coupling to the longitudinal axial-bulk-wave is also zero when the coupling to the said shear axial-bulk-wave is zero.

Sometimes, however, it is possible to find an orientation for which the piezoelectric coupling between an interdigital electrode array and the shear axial-bulk-wave with particle motion parallel to the surface $x_1 x_2$ is effectively zero, but a certain amount of coupling is present between the interdigital electrode array and the longitudinal axial-bulk-wave. When such an orientation also provides a relatively large piezoelectric coupling factor between the interdigital electrode array and the piezoelectric body in respect of acoustic surface waves, as in the case of bismuth silicon oxide for example, it can be advantageous in an intermediate frequency filter device as hereinbefore mentioned.

Alternatively, if orientations exist for which the modulii $d_{11}$ and $d_{31}$ are zero when $\phi = 0$ or satisfy the equation (1) when $\phi \neq 0$, but the corresponding piezoelectric couplings to the shear axial-bulk-waves are not zero, an orientation of the acoustic surface wave propagation surface $x_1 x_2$ is selected such that the shear axial-bulk-waves, although generated by the interdigital electrode array in the direction of the acoustic surface wave propagation axis $x_1$, is nevertheless substantially unable to propagate in a direction parallel to the surface $x_1 x_2$. This situation will occur, as has been mentioned above, when each of the shear axial-bulk-waves has a significant component of motion perpendicular to the surface. The boundary conditions at the surface will then be such that each wave will tend to decrease in amplitude as the distance from the launching transducer is increased.

Figure 2:
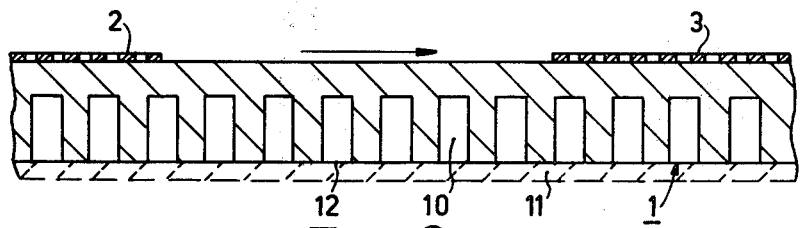

In order that the invention may be clearly understood and readily carried into effect, embodiments thereof will now be described by way of example, with reference to the accompanying drawings, in which:

FIG. 1 illustrates an embodiment in which an acoustic surface wave filter employing generalised Rayleigh type waves is formed of bismuth silicon oxide, FIG. 2 is a diagrammatic longitudinal sectional detail of FIG. 1 illustrating the propagation of bulk waves.

Figure 3:
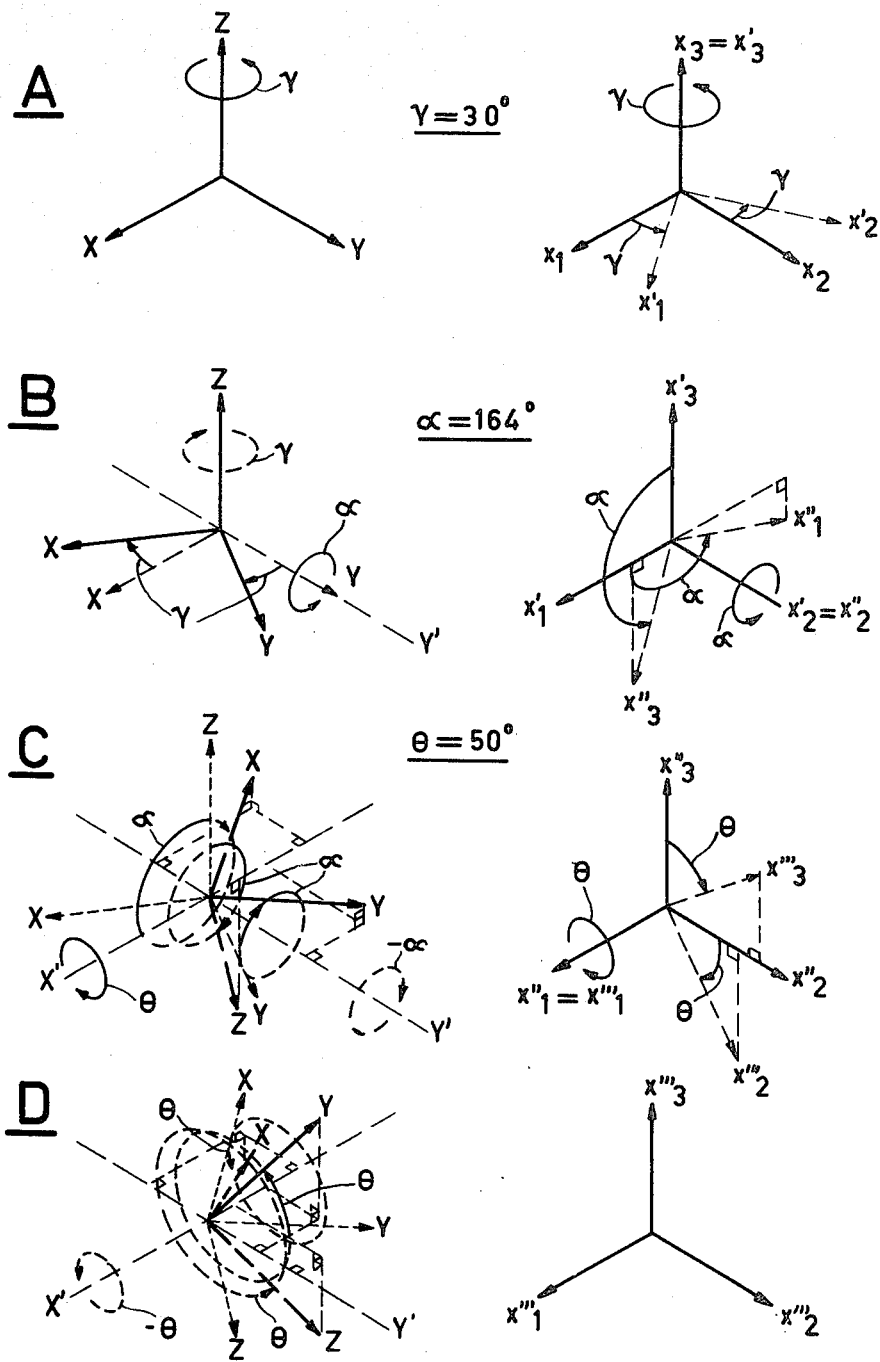
Figure 4A:
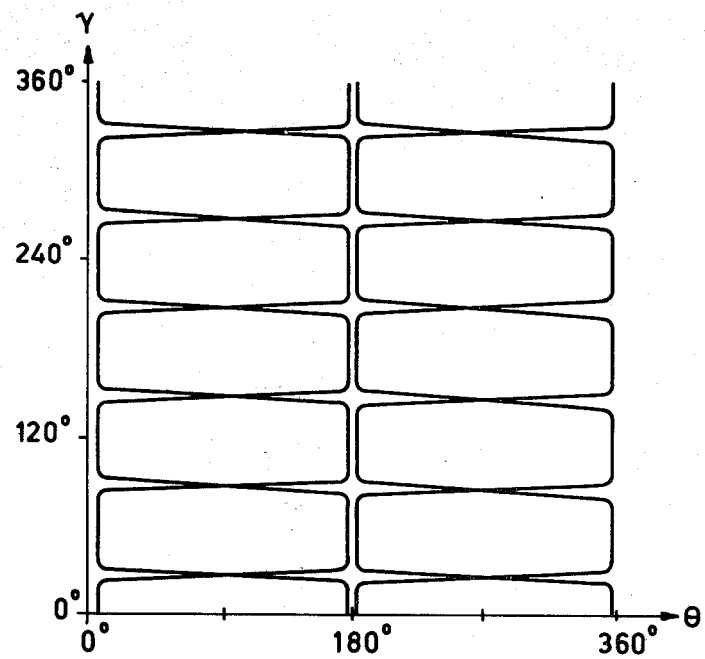
Figure 5A:
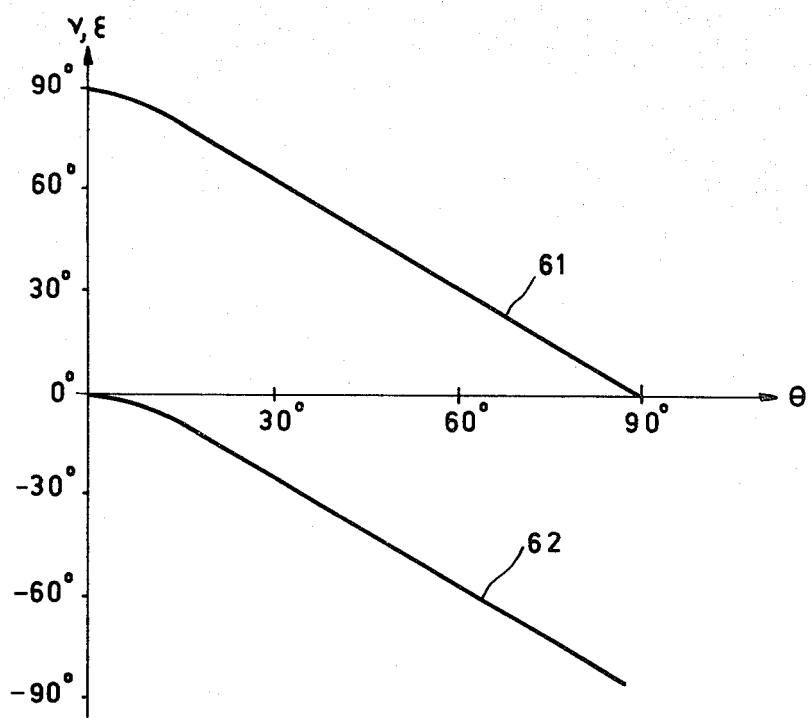
Figure 6:
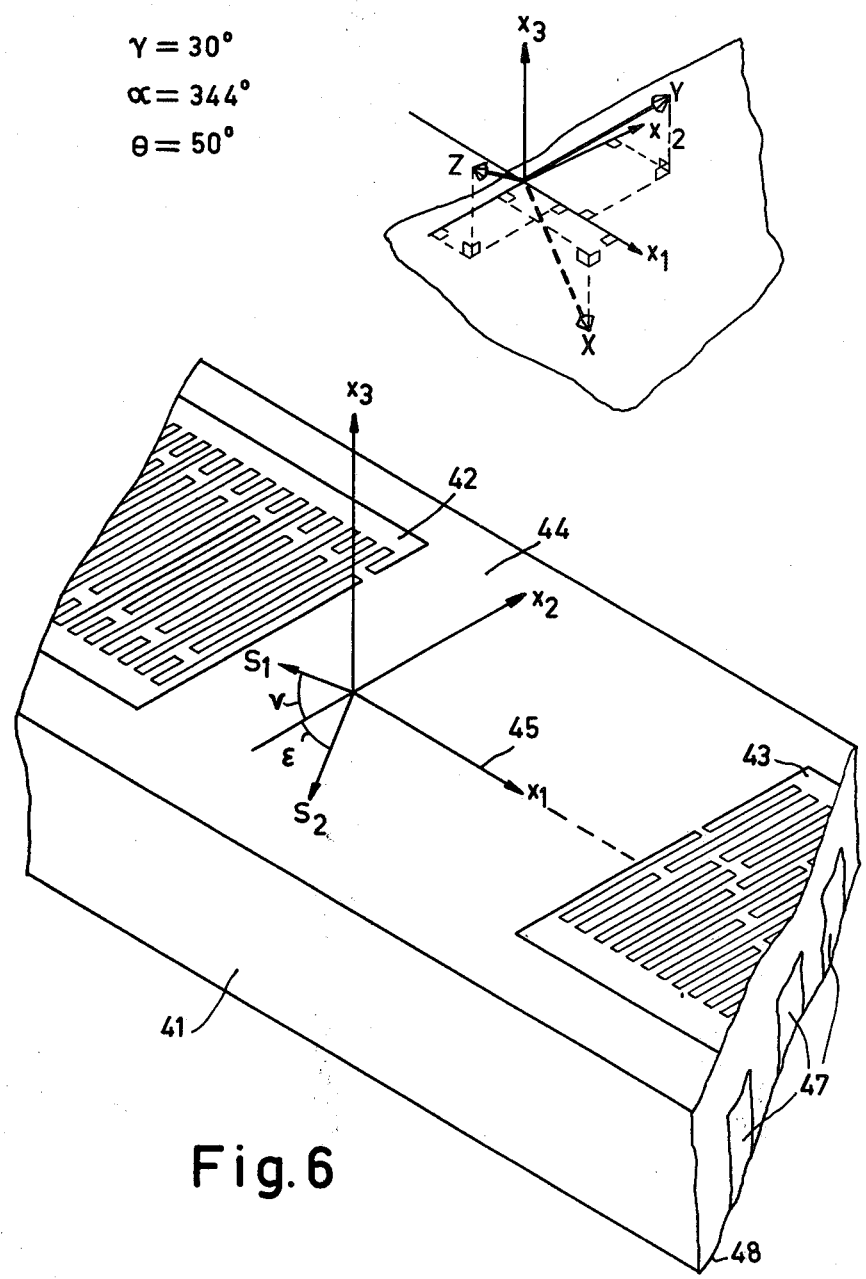
Figure 7:
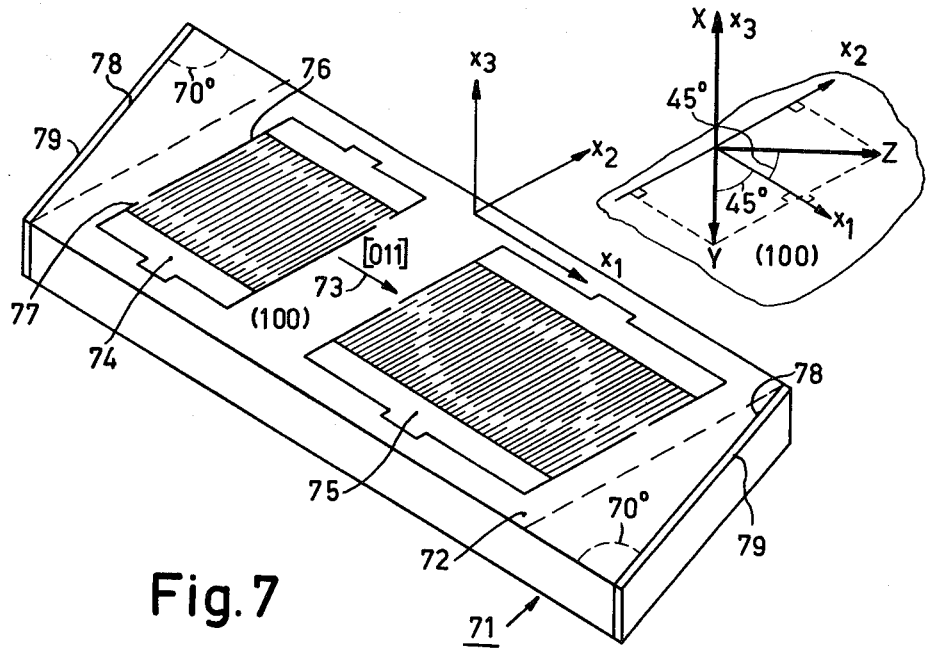
Figure 8:
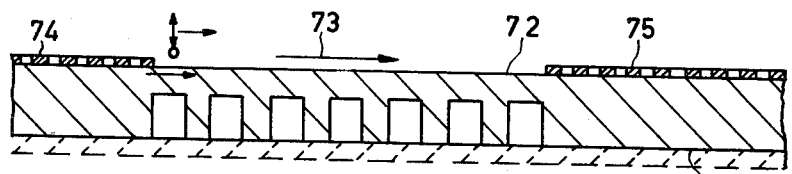
Figure 9:
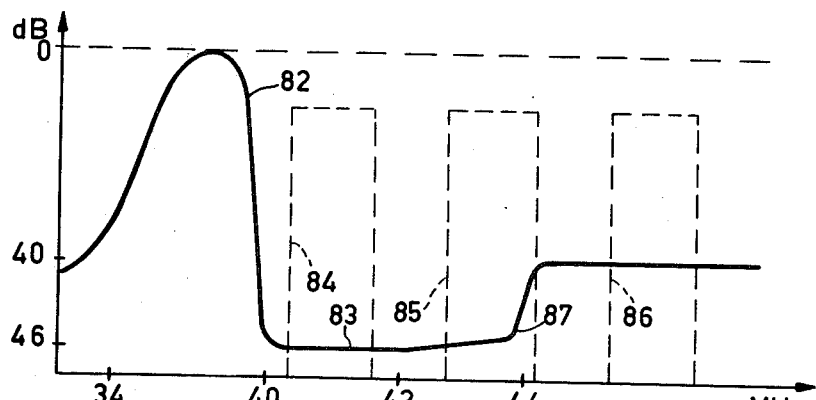

FIG. 3 comprises a series of diagrams illustrating the crystal orientation in the case of lithium niobate, FIGS. 4A and B are graphs indicating the values of $\gamma$ $\theta$ and $\alpha$ for zero longitudinal bulk wave generation along $x_1$, FIGS. 5A and B are graphs indicating the variation of $\gamma$, $\epsilon$ and $k^2$ with $\theta$, FIG. 6 illustrates the propagation of a bulk shear wave in an acoustic surface wave filter employing a monocrystal of lithium niobate and embodying the invention, FIG. 7 illustrates in perspective an acoustic surface-wave filter in a further embodiment of the invention, FIG. 8 is a longitudinal sectional detail relating to FIG. 7, and FIG. 9 is a graph depicting response versus frequency relating to the filter shown in FIG. 7.

An acoustic surface wave filter embodying the invention is manufactured by growing a monocrystal of bismuth silicon oxide using normal crystal growing techniques. The crystal is then examined using X-ray diffraction techniques in order to determine the orientation of the crystallographic axes with respect to a reference surface on the crystal. The crystal is then cut parallel to a (110) plane to form a plurality of slices.

Each slice is then subjected to a normal process of polishing, cleaning and the application by photo-lithography of a matrix of pairs of interdigital electrode arrays oriented so that the acoustic surface wave propagation path from each launching transducer to the corresponding receiving transducer of the pair is directed parallel to a zone axis defined by the zone symbol [001]. The slice is then cut up into portions each containing one launching transducer and the corresponding receiving transducer to form an acoustic surface wave filter element which is illustrated in FIG. 1, in which the bismuth silicon oxide body is indicated by the reference 1 and the reference numerals 2 and 3 indicate the launching and receiving interdigital transducers respectively.

The frequency response of the transducers 2 and 3 is defined by such factors as the spacing of adjacent electrodes, the relative overlap of adjacent electrodes of opposite polarity and the width of the electrodes, as is well known in the art. Since the interdigital transducer normally gives rise to two acoustic surface waves travelling in opposite directions, it may be necessary to apply acoustic absorbing material 4, 5 at each end of the device. Alternatively, or preferably in addition, the ends can be cut obliquely so that they are not at right angles to the acoustic surface wave propagation direction and reflected waves are thereby directed and scattered so that they produce substantially no effect in the output of the receiving transducer. The lower surface of the device is treated in order to scatter and attenuate bulk waves which are directed thereat by the transmitting transducer. Examples of such treatment include the formation of recesses 10 in the lower surface 12 for scattering the bulk waves, as described and claimed in the aforesaid co-pending U.S. Pat. application Ser. No. 501,482, and the application of an acoustic attenuating medium 11 to the lower surface 12, shown in FIG. 2.

Electrical connections are made between the electrodes and external connecting and support pins in a conventional manner. The device is protected by suitable encapsulation bearing in mind that the acoustic surface wave propagation surface on which the transducers are located and the acoustic surface wave propagation path therebetween must not be in contact with any substance likely to absorb or modify the desired propagation of surface waves.

The initial selection of bismuth silicon oxide as a suitable crystalline substance for use in an embodiment of the invention was carried out as follows. A computer was programmed to calculate the piezoelectric constants relating electrical polarisation to stress $d_{ij}$ (reduced indices described in Nye referred to above) where $i = 1, 2, 3$ and $j = 1, 2, 3, 4, 5, 6$ for an arbitrary othogonal set of axes $x_1$ $x_2$ $x_3$, from varius measured parameters of bismuth silicon oxide. Computation was carried out for various orientations of the set of axes $x_1$ $x_2$ $x_3$ with respect to the crystallographic axes X, Y and Z, until an orientation was found for which $d_{11}$, $d_{31}$, $d_{16}$, $d_{36}$ were simultaneously substantially zero, but that other piezoelectric constants necessary for an acoustic surface wave to be launched and received in the $x_1$ direction in the $x_1$ $x_2$ plane by means of an interdigital electrode array, were of sufficient magnitude.

This procedure indicates that the acoustic surface wave propagation surface should be orientated parallel to the (110) lattice plane of the crystal in order to satisfy this criterion. Since bismuth silicon oxide is a cubic crystal, symmetry considerations indicate that this is equivalent also to the ($\bar{1}$10), (1$\bar{1}$0) and ($\bar{1}\bar{1}$0) planes. In addition since in the cubic crystal the (orthogonal) crystal axes X Y Z are interchangeable, the propagation surface can alternatively be arranged parallel to the (101) plane or the (011) plane and the corresponding negative permutations thereof as before such as ($\bar{1}$01), (0$\bar{1}$1). Thus when an interdigital electrode array is formed on the surface parallel to the (110) plane to direct an acoustic surface wave along the [001] direction a Rayleigh wave is propagated.

Another crystalline substance in the same cubic crystal class 23 as bismuth silicon oxide is bismuth germanium oxide, for which the same orientations apply. In fact any satisfactorily piezoelectrically active crystalline substance in the cubic class 23 or $\bar{4}3$ m will provide the same result when orientated in the directions hereinbefore stated.

In an alternative form of the invention a monocrystalline material and an orientation are selected for which, as before, the coefficient of coupling between the interdigital transducer array and the longitudinal bulk wave directed along $x$, are zero, but either there is no said orientation for which a corresponding zero coupling exists for a shear bulk wave directed along $x$, having a particle motion parallel to the propagation surface $x_1$ $x_2$ as in the case, for example, of lithium niobate, or while there is a said orientation providing zero shear bulk wave coupling it is desired, because of other considerations, to employ another said orientation, and this can occur in the case of bismuth silicon oxide or bismuth germanium oxide.

An embodiment of this form of the invention, which comprises an acoustic surface wave filter employing a monocrystalline body of lithium niobate, will now be described with reference to FIGS. 3, 4, 5 and 6.

A monocrystal of lithium niobate is grown in a polarising field using normal crystal growing techniques. The monocrystal is then subjected to X-ray diffraction analysis to determine the orientation of a reference surface formed on the crystal with respect to the normal crystallographic axes X, Y, Z, as in the first embodiment. The crystal is then sliced along a plane, whose orientation with respect to the crystallographic axes is that described hereinafter, to form a plurality of wafers. Pairs of interdigital electrode arrays are formed as described with respect to the first embodiment on one surface of each wafer in a matrix pattern so that the acoustic surface wave propagation path for each pair is directed parallel to the $x_1$ direction described hereinafter. As in the first embodiment, the wafer is cut up into portions each containing a launching and a receiving electrode array and is treated so that, as far as possible, unwanted acoustic wave and bulk wave disturbances are scattered or absorbed, and is then encapsulated as described with reference to the first embodiment.

The orientation of the acoustic surface wave propagation plane $x_1$ $x_2$ and the propagation direction $x_1$ with respect to the crystallographic directions X Y Z is again determined from measured crystallographic parameters by means of a suitable computer programme. In this case a range of orientations are first determined for which $$d_{11} + \tfrac{1}{2}d_{16} \tan \phi = 0$$

$$d_{31} + \tfrac{1}{2}d_{36} \tan \phi = 0$$

this being the criterion for the non-generation or detection of longitudinal axial-bulk-waves travelling directly from the launching transducer to the receiving transducer in a direction $x_1$ parallel to the propagation surface.

Within the aforementioned range, the respective angles formed between the propagation surface $x_1$ $x_2$ and the transverse particle motion of each shear axial-bulk-wave travelling along the direction $x_1$ together with their velocities relative to each other are computed. An orientation is then selected from that part of the range for which the particle motion of each of the shear axial-bulk-waves are inclined at least 5° to the propagation surface and the velocities are different, and which also enables a good degree of coupling to be obtained between an interdigital electrode array arranged to launch or receive an acoustic surface wave in the direction $x_1$, and the piezoelectric body formed from the monocrystal. In accordance with normal computing practice discrete spaced values are computed within the range, but the continuity of the determining functional relationship is tested in accordance with normal mathematical practice to indicate where interpolation methods can be employed to arrive at an orientation lying between two computed values, if desired. The orientation thus arrived at of the directions $x_1$ and $x_2$ with respect to the crystal axes is then used to set the direction of the crystal cut in the aforementioned slicing operation and to determine the orientation of the applied interdigital electrode arrays with respect to the slice so formed.

In order to illustrate the relationship between the orthogonal set of reference axes $x_1$ $x_2$ $x_3$ defining the acoustic surface wave propagation direction $x_1$ and surface $x_1$ $x_2$, and the crystallographic axes X Y Z of the lithium niobate crystal, reference will now be made to FIG. 3. In the description which follows, the positive directions of the crystallographic axes X Y Z, are defined such that if the crystal is subjected to an extension along a respective axis a positive charge appears on a crystal face directed outwardly along the positive direction of that axis.

Orientation of the set of reference axes $x_1$, $x_2$ $x_3$ with respect to the crystallographic axes X Y Z, which in the case of lithium niobate are also orthogonal, will be defined in terms of three angular displacements $\gamma$, $\alpha$ and $\theta$ which are successively applied to the set of reference axes starting from an initial condition in which the axes $x_1$, $x_2$, $x_3$ are respectively arranged parallel to the corresponding crystallographic axes X Y Z, as illustrated in the diagram A of FIG. 3. In the following description a common origin will be assumed for the axes X Y Z and $x_1$ $x_2$ $x_3$, although the diagrams are separated for clarity.

The first angular displacement of the axes $x_1$, $x_2$ $x_3$ to the position $x'_1$ $x'_2$ $x'_3$ is made about the Z crystallographic axis by an angle $\gamma$, a positive angular displacement being in a clockwise direction when looking in a positive direction along the Z-axis. This is illustrated in FIG. 3 diagram A by the axes $x'_1$ and $x'_2$.

In diagram B the system of axes have been transformed by a counter rotation shown dotted, equal to $\gamma$ about the Z axis, to return the reference axes $x_1$ $x_2$ $x_3$ to their original orientation, the transformed orientation of the crystal axes X Y Z being indicated by the full lines in the left hand diagram. The second angular displacement $\alpha$ is effected about a new Y-axis which is parallel to the direction of the axis $x_2$ after the first angular displacement and indicated by Y' in diagram B. This angular displacement is also taken as positive in a clockwise direction when viewed along the Y' axis and the effect thereof on the reference axes is illustrated by the axes $x''_1$ and $x''_3$.

In diagram C, the reference axes have been returned to their original orientation by effecting a reverse angular displacement $\alpha$ shown dotted, about the axis Y'. The third angular displacement $\theta$ is then effected about a new X-axis which is parallel to the direction of the axis $x_1$ after the second angular displacement, and indicated by X' in diagram C. In the present example the positive sense of this displacement is taken to be anticlockwise when viewed along the X' axis.

On completion of the third angular displacement $\theta$, the desired acoustic surface wave propagation surface $x_1$ $x_2$ and propagation direction $x_1$ are oriented with respect to the crystal body in accordance with the angular displacement parameters $\gamma$, $\alpha$, $\theta$ and this is illustrated, after a corresponding reverse angular displacement $\theta$ of the crystal axes X Y Z about the axis X', in the diagram D. It is emphasized, however, that the angular displacements must be applied to the system in the order described.

The series of orientations for which there is substantially no coupling between an interdigital launching or receiving transducer and a longitudinal axial-bulk-wave directed along $x_1$ has been computed for lithium niobate for each of an appropriate sequence of values of the angle $\theta$ and the corresponding values of $\gamma$ and $\alpha$, which are tabulated hereinafter. For a complete account of all possible orientations the total range 0°–360° should be covered for each of the angles $\gamma$, $\alpha$ and $\theta$. However, for reasons of crystal symmetry a cyclic repetition occurs at intervals of 120° in the rotation $\gamma$ about the Z-axis, an axis of three-fold symmetry, and the final rotation $\theta$ which amounts to rotating the $x_1$ $x_2$ plane about the direction $x_1$, exhibits a 180° repetition since opposite surfaces of the plane $x_1$ $x_2$ will be equivalent to each other.

Figure 4B:
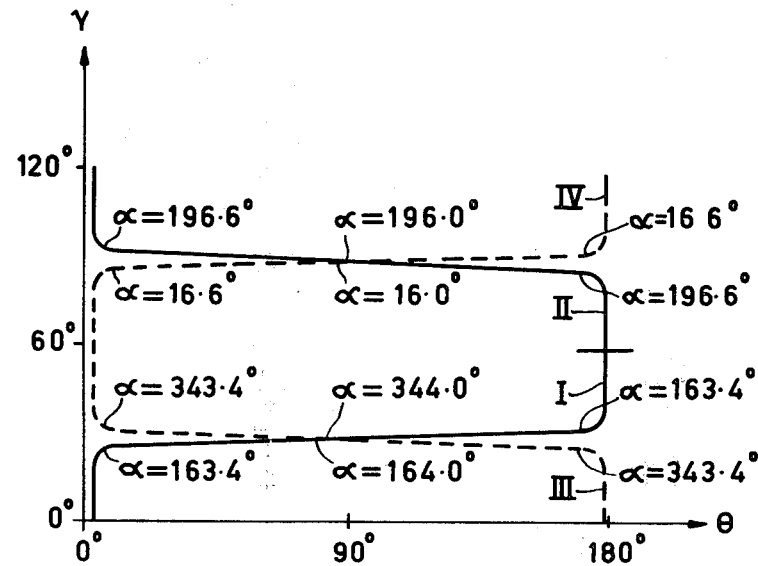

The locus of the zero direction for the excitation of longitudinal axial-bulk-waves by an interdigital transducer is illustrated in FIG. 4a as a two-dimensional plot in $\gamma$ and $\theta$ with the angle $\alpha$ perpendicular to the paper. One cycle of the pattern is shown in FIG. 4b and it will be observed that one of the locii traces a path which is 180° above the other in $\alpha$. This again is the result of inverting the $x_1$ $x_2$ plane, in this case about the new Y-axis.

The following tables I, II, III and IV refer to the corresponding branches I, II, III and IV indicated on FIG. 4b. In each of the tables the centre column should be read in conjunction with either the first two columns or the last two columns since the values of $\alpha$ repeat with complementary values of $\theta$ and $\gamma$ about the centre of the respective range.

TABLE I

First branch for which $\gamma$ varies from 0° to 60° and $\alpha$ varies about the value of 164°.

| $\theta$ | $\gamma(=\gamma_1)$ | $\alpha$ | $\gamma(=60-\gamma_1)$ | $\theta$ |
|---|---|---|---|---|
| 0 | — | — | — | 180 |
| 2.5 | 18.401 | 165.726 | 41.599 | 177.5 |
| 3.0 | 21.855 | 164.419 | 38.145 | 177.0 |
| 5.0 | 25.463 | 163.597 | 34.537 | 175.0 |
| 10.0 | 27.385 | 163.437 | 32.615 | 170.0 |
| 30.0 | 28.777 | 163.609 | 31.223 | 150.0 |
| 60.0 | 29.471 | 163.810 | 30.529 | 120.0 |
| 90.0 | 30.000 | 163.936 | | |

TABLE II

Second branch for which $\gamma$ varies from 60° to 120° and $\alpha$ varies about the value of 196°.

| $\theta$ | $\gamma(=\gamma_1)$ | $\alpha$ | $\gamma(=180-\gamma_1)$ | $\theta$ |
|---|---|---|---|---|
| 0 | — | — | — | 180 |
| 2.5 | 101.599 | 194.274 | 78.401 | 177.5 |
| 3.0 | 98.145 | 195.581 | 81.855 | 177.0 |
| 5.0 | 94.537 | 196.403 | 85.463 | 175.0 |
| 10.0 | 92.615 | 196.563 | 87.385 | 170.0 |
| 30.0 | 91.223 | 196.391 | 88.777 | 150.0 |
| 60.0 | 90.529 | 196.191 | 89.471 | 120.0 |
| 90.0 | 90.000 | 196.066 | | |

TABLE III

Third branch for which $\gamma$ varies from 0° to 60° and $\alpha$ varies about the value 344°.

| $\theta$ | $\gamma(=\gamma_1)$ | $\alpha$ | $\gamma(=60-\gamma_1)$ | $\theta$ |
|---|---|---|---|---|
| 0 | — | — | — | 180.0 |
| 2.5 | 41.599 | 345.726 | 18.401 | 177.5 |
| 3.0 | 38.145 | 344.419 | 21.855 | 177.0 |
| 5.0 | 34.537 | 343.597 | 25.463 | 175.0 |
| 10.0 | 32.615 | 343.437 | 27.385 | 170.0 |
| 30.0 | 31.223 | 343.609 | 28.777 | 150.0 |
| 60.0 | 30.529 | 343.810 | 29.471 | 120.0 |
| 90.0 | 30.000 | 343.936 | | |

TABLE IV

Fourth branch for which $\gamma$ varies from 60° to 120° and $\alpha$ varies about the value 16°.

| $\theta$ | $\gamma(=\gamma_1)$ | $\alpha$ | $\gamma(=180-\gamma_1)$ | $\theta$ |
|---|---|---|---|---|
| 0 | — | — | — | 180.0 |
| 2.5 | 78.401 | 14.274 | 101.599 | 177.5 |
| 3.0 | 81.855 | 15.581 | 98.145 | 177.0 |
| 5.0 | 85.463 | 16.403 | 94.537 | 175.0 |
| 10.0 | 87.385 | 16.563 | 92.615 | 170.0 |
| 30.0 | 88.777 | 16.391 | 91.223 | 150.0 |
| 60.0 | 89.471 | 16.191 | 90.529 | 120.0 |
| 90.0 | 90.000 | 16.066 | | |

The values shown in the tables relate to various discrete values of $\theta$ which represent points lying on the continuous lines in $\gamma, \alpha, \theta$ space shown in FIG. 4, and any point lying on one of these lines provides the condition for zero coupling of an interdigital transducer to the longitudinal bulk wave directed along $x_1$.

Computation was then carried out to determine the values for the coupling between the interdigital launching electrode array and the shear axial-bulk-waves launched thereby along the $x_1$ direction. Determination was made thereby of such factors as the angle between the transverse particle motion of each of the shear axial-bulk-waves and the surface $x_1 x_2$, the coupling factor $k^2$ between the interdigital electrode array and the desired acoustic surface wave, and the surface wave velocity. Table V indicates the corresponding values over the range covered by the fist branch given in Table I and shown in FIG. 4B.

Table V

Figure 5B:
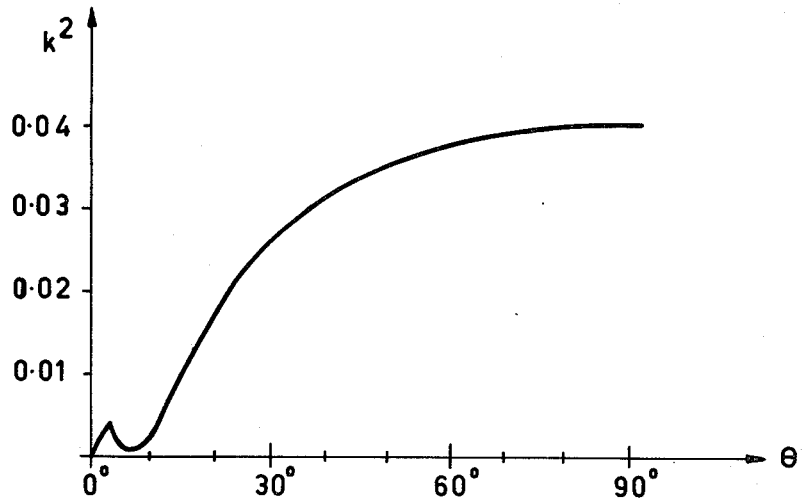

| $\gamma$ | $\alpha$ | $\theta$ | surface wave velocity | $k^2$ | Slow shear wave Polarisation angle with surface (degrees). |
|---|---|---|---|---|---|
| 0 | 0 | 0 | 3.75306 | 0 | — |
| 18.401 | 165.726 | 2.5 | 3.79848 | 0.0028 | — |
| 21.855 | 164.419 | 3 | 3.78819 | 0.0014 | — |
| 25.463 | 163.597 | 5 | 3.76990 | 0.0003 | — |
| 27.385 | 163.437 | 10 | 3.76377 | 0.0011 | — |
| 28.777 | 163.609 | 30 | 3.72116 | 0.0261 | 28.0 |
| 29.165 | 163.731 | 45 | 3.67352 | 0.0332 | 43.6 |
| 29.471 | 163.810 | 60 | 3.64458 | 0.0356 | 59.2 |
| 29.726 | 163.915 | 75 | 3.63082 | 0.0360 | 74.5 |
| 30.000 | 163.936 | 90 | 3.62629 | 0.03595 | 90.0 | sets of values can be computed for the other branches of the curves shown in FIG. 4B and hence for the whole field of orientations shown in FIG. 4A. FIG. 5A is a graph depicting the variation of the angle that the transverse particle motion of each of the shear axial-bulk-waves makes with the surface $x_1 x_2$. The slow and the fast shear axial-bulk-waves have particle motions which are substantially perpendicular to each other and the values for the slow shear axial-bulk-wave have been extrapolated to indicate the variation thereof in the range $\theta = 0°$ to 30°. The variation of the acoustic surface wave coupling factor $k^2$ over the range is shown in FIG. 5B and from this it will be seen that the acoustic surface wave is well coupled over the range of $\theta$ extending from about 30° to 90°, although any value above about 0.02 can be considered useful in some circumstances. From FIG. 5A it will be observed that the slow shear axial-bulk-wave has a particle motion indicated by curve 61 which is parallel to the propagation surface $x_1 x_2$ when $\theta = 90°$ and so for this value of $\theta$ the slow shear wave will travel parallel to the propagation surface in the direction $x_1$ and reach a corresponding interdigital transducer array located in the path thereof in order to receive acoustic surface waves, a situation which is undesirable in an acoustic surface wave device.

In order to manufacture the present embodiment of the invention, an orientation of the $x_1 x_2$ plane relative to the XYZ crystal axes is therefore selected from the values of $\gamma, \alpha, \theta$ lying on either curve depicted in FIG. 4A for which the angle $\gamma, \epsilon$ between the particle motions of each of the respective shear axial bulk-waves and the propagation surface $x_1 x_2$ are both greater than about 5° and the coupling factor $k^2$ for the acoustic surface wave is greater than about 0.02.

FIG. 6 is a perspective diagram of a portion of an acoustic surface wave filter comprising the present embodiment in which a body 41 is formed as described hereinbefore from a wafer of a monocrystal of lithium niobate by slicing parallel to the plane $x_1 x_2$, the orientation of which is arranged relative to the X, Y, Z axes of the monocrystal within the ranges satisfying the above conditions as described with reference to FIGS. 4 and 5. An interdigital launching transducer array 42 launches an acoustic surface wave along the direction 45 towards a corresponding receiving transducer 43, and also in the opposite direction, although the latter wave is scattered and/or absorbed by either cutting the end of the wafer at an angle of about 70° and/or by the application of a surface wave absorbing medium to the ends of the wafer. FIG. 6 illustrates the propagation of shear axial-bulk-waves $S_1 S_2$ also generated by the array 42. In a range of frequencies dependent on the propagation velocity of the respective shear bulk wave and the spatial periodicity of the transducer array, a shear axial-bulk-wave will be generated in a direction parallel to the direction 45. Both the fast and the slow shear axial-bulk-waves have velocities which are slightly greater than that of the acoustic surface waves and therefore the frequencies at which the respective shear waves are directed parallel to the surface will lie above the pass-band of the acoustic surface wave filter but in a region where, for many purposes, a large amount of attenuation is required.

The shear axial-bulk-waves $S_1 S_2$ have transverse particle motions inclined respectively at angles $\gamma$ and $\epsilon$ to the acoustic surface wave propagation surface ($x_1 x_2$) denoted by the reference 44. When the angle between the particle motion of a shear bulk wave and the surface is not equal to zero the shear wave is unable to propagate adjacent the surface and becomes evanescent, dying away as the distance from the array 42 is increased. However, since the particle motions of the two shear axial-bulk-waves are substantially at right angles to each other, when the particle motion of one is perpendicular to the surface that of the other shear axial-bulk-wave will be parallel to the surface and therefore undeflected, resulting in a maximum unwanted output from the receiving transducer 43. Provided that $\gamma$ and $\epsilon$ are greater than about 5° the corresponding shear axial-bulk-wave will become evanescent to an extent which enables a suitable spacing of the transducers 42 and 43 to be arranged for an appropriate degree of attenuation of the unwanted output. Preferably both $\gamma$ and $\epsilon$ are arranged to lie in the range 30° to 60°. The velocities of the shear axial-bulk-waves $S_1, S_2$ must however be different otherwise a resultant particle motion could be set up parallel to the surface 44 and the corresponding bulk wave disturbance would propagate parallel to the surface and reach the receiving transducer 43.

It will be observed from FIG. 4 that over a range of values of approximately $30° < \theta < 150°$ and over the corresponding range $210° < \theta < 330°$, the values of $\gamma$ and $\alpha$ vary by only a small amount. For example in one branch $\gamma$ varies about the value 270° by $\pm 1.2°$ and $\alpha$ varies about the value 343.9° by 0.3° and this part of the curve can be approximated by $\gamma = 270°$ $\alpha = 344°$ with $\theta$ varying from 30° → 150°. Using this branch, the desired crystal cut which forms the acoustic surface wave propagation surface $x_1$ $x_2$ can be regarded as rotatable about the $x_1$ direction defined by $\gamma = 30°$ and $\alpha = 344°$ and this direction lies in the X-plane and is rotated 16° from the -Y axis towards the Z-axis. Thus the varying orientations corresponding with the permitted values of $\theta$ of 30° → 85° and 95° → 150° are rotated X- cuts about the said direction, in other words a boule series of cuts. Since there are three X-directions 120° apart about the Z-axis any of these can be employed for this purpose.

Thus when manufacturing the present embodiment the crystal is first cut to form an X plane with a reference edge directed along the direction $\gamma = 270°$ $\alpha = 344°$. The crystal is then rotated about the reference edge to cut the surface having the desired value of $\theta$ within the said range, bearing in mind that the reference edge lies in the X-plane and is represented by the point $\theta = 90°$ on the curve in FIG. 4. This means that the direction of rotation about the reference edge is immaterial since the piezoelectric properties are symmetrical about $\theta = 90°$.

The lower surface of the wafer must be treated, as in the first embodiment, so that bulk waves will be effectively scattered and or absorbed, and thus prevented from passing from one transducer to the other by reflection from the lower surface of the wafer. A suitable arrangement is described and claimed in our aforesaid copending U.S. Pat. application in which a plurality of recesses 47 are distributed over the major surface 48 of the wafer which does not form the acoustic surface wave propagation surface.

A further embodiment of the invention will now be described with reference to FIGS. 7, 8 and 9, in which FIGS. 7 and 8 illustrate in perspective and partial longitudinal section an acoustic surface-wave television intermediate frequency filter for an intermediate frequency of 37 MHz. A wafer 71 is cut from a monocrystal of a suitable piezoelectric cubic crystal, in this example bismuth silicon oxide ($Bi_{12}SiO_{20}$), so that an acoustic surface-wave propagation surface 72, which comprises one of the major surfaces the wafer, is oriented parallel to the (100) crystallographic plane of the monocrystal. In order to accomplish this, the crystallographic axes of the monocrystal are determined in known manner using X-ray diffraction and, after slicing, launching and receiving interdigital transducers 74, 75 are formed on the surface 72, conveniently from a layer of gold using for example the techniques of photolithography, so that the acoustic surface-wave propagation direction 73 for an acoustic surface wave launched by the transducer 74 and received by the transducer 75 is directed along the zone axis [ 011 ] or in the opposite direction [ 0$\bar{1}\bar{1}$ ]. In normal production a matrix pattern of transducer pairs 74, 75 is formed on one slice with the said orientation and the slice is subsequently divided up into individual wafers.

The form, spacing and weighting of the electrodes 76 of the interdigital transducers 74 and 75 are designed in conventional manner to provide the desired pass-band for the filter. In orde to simplify the design procedure, the electrodes of one of the transducers, namely 74, are made of uniform length and width, the weighting being confined to those of the transducer 75. Dummy electrode portions 77 are introduced to fill the space between adjacent electrode elements connected to the same terminal connection where the interposed electrode element has been shortened in order to maintain the acoustic surface-wave velocity constant across the array and thus avoid undesired distortion of the beam. The ends 78 of the wafer 71 are cut at an angle of approximately 70° to the acoustic surface-wave propagation direction to scatter the unwanted beam radiated by the transducer 74 away from the transducer 75 and by the transducer 75 away from the transducer 74 and acoustic absorbing material 79 is applied to the ends 78 of the wafer.

The other major surface 80 of the wafer is treated so that bulk wave disturbances directed thereat by the transducers 74 and 75 are effectively absorbed and/or scattered and do not reach the other transducer causing an undesired output. One method of treatment is to form a plurality of discrete recesses in the lower surface which extend to within a few acoustic surface-wave wavelengths of the propagation surface 72, as described and claimed in our aforesaid co-pending U.S. Pat. application.

Referring to the graph shown in FIG. 9, which depicts the output signal magnitude against frequency for a constant input signal magnitude, the line 82 represents the desired filter pass-band response to be provided by the acoustic surface-wave filter. The region 83 adjacent the pass-band is a relatively deep stop-band which is necessary in order to remove interference from the sound carrier of an adjacent television channel. By the choice of the crystallographic orientation in bismuth silicon oxide embodying the invention, a horizontally-polarised shear wave, i.e. a shear wave having a particle motion parallel to the propagation surface, cannot be launched in the direction 73 by an interdigital transducer 74 because the relevant piezoelectric coupling coefficients are effectively zero. If this were not so the resultant shear wave would be generated by signals applied to the transducer 74, which lie in the band indicated approximately by the dashed line 84 and would give rise to a corresponding undesired output.

In the orientation embodying the invention, vertically-polarised shear waves, i.e. waves having a particle motion perpendicular to the propagation surface, are launched by the transducer 74 in the direction 73 parallel to the propagation surface within the frequency band indicated approximately by the dashed line 85. However, a shear wave with a particle motion perpendicular to the surface is unable to propagate in a direction parallel to the surface 72 and is attenuated as the distance from the transducer 74 is increased. The transducers 74 and 75 are spaced by a distance which ensures that unwanted energy in the form of a vertical shear wave is sufficiently attenuated, and is effectively prevented from giving rise to an unwanted output signal.

A longitudinal wave is launched by the transducer 74 and propagates in the direction 73 parallel to the surface to reach the transducer 75. However, in the orientation embodying the invention the values of the piezoelectric coefficients which cause this bulk wave to be launched by an interdigital transducer are such that, in relation to the magnitude of the coupling factor for acoustic surface waves, the unwanted bulk wave output, indicated by the dashed line 86 in FIG. 9, has an amplitude below the desired rejection level for the filter within the corresponding range of frequencies and is therefore acceptable.

Other equivalent crystallographic orientations and equivalent crystallographic planes as herein defined can equally well be employed, and the invention can also be applied with advantage to devices whose function is primarily one of providing a signal delay, since the undesired bulk waves travel at different velocities from that of the acoustic surface wave.

What is claimed is:

1. A method of manufacturing an acoustic surface wave device comprising the steps of forming a monocrystalline body of a selected piezoelectric substance, forming a planar acoustic surface wave propagation surface on said body oriented in a selected manner with respect to the crystallographic axes of said monocrystal, and applying launching and receiving interdigital electrode arrays to said acoustic surface wave propagation surface respectively to launch and to receive acoustic surface waves along a selected acoustic surface wave propagation axis on said surface so as to provide a desired amplitude-frequency response, said piezoelectric substance and the orientation of said respective acoustic surface wave propagation surface and axial propagation direction relative to the crystallographic axes of said monocrystalline body being selected to provide substantially zero piezoelectric coupling between said interdigital electrode arrays and at least one of the group of axial-bulk-waves including the longitudinal axial-bulk-wave and that one of the two shear axial-bulk-waves which has substantially no component of particle motion at right angles to said acoustic surface wave propagation surface, whereby the piezoelectric coupling between a respective interdigital electrode array and the axial-bulk-waves which are generated thereby are small enough to prevent a significant disturbance of the desired amplitude-frequency response of the device.

2. A method as claimed in claim 1 in which the piezoelectric substance, the acoustic surface wave propagation surface represented by coordinates $x_1$ $x_2$ and the acoustic surface wave propagation axis represented by the direction of the coordinate $x_1$ are selected so that $$d_{11} + \tfrac{1}{2} d_{16} \tan \phi = 0$$

and $$d_{31} + \tfrac{1}{2} d_{36} \tan \phi = 0$$

where $\phi$ is the angle, measured in the plane $x_1$, $x_2$, that the particle motion of a generated longitudinal axial-bulk-wave would make with said $x_1$ direction, and $d_{11}$, $d_{31}$, $d_{16}$ and $d_{36}$ are respective piezoelectric constants, using reduced indices, which relate to the surface $x_1$, $x_2$.

3. A method as claimed in claim 2 in which said piezoelectric substance is lithium niobate and the step for forming the planar propagation surface includes the steps of cutting a monocrystal of lithium niobate to form a crystallographic X-plane with a reference edge directed along the direction formed by a rotation as herein defined of $\gamma = 270°$, $\alpha = 344°$ or a crystallographic equivalent, of a direction initially parallel to a corresponding one of the crystallographic equivalent X-axis, aligning said X-plane parallel to the cutting plane of a crystal-cutting device, rotating said crystal about said reference edge in either direction by an angular displacement lying in the range 5° to 60° (equivalent to $\theta = 85°$ 30° or 95° 150° or crystallographic equivalents), and cutting said crystal to form said acoustic surface wave propagation surface.

4. A method as claimed in claim 2 wherein the piezoelectric substance and the propagation surface orientation are chosen so that said two shear axial-bulk-waves are generated by said interdigital electrode array and the crystallographic orientation is such that the direction of particle motion for each said shear axial-bulk-wave is inclined at an angle of at least 5° to the acoustic surface wave propagation surface, and the receiving transducer is spaced from the launching transducer in the direction of propagation of acoustic surface waves so that effect at said receiving transducer of said sheer axial-bulk-waves generated by said launching transducer is negligible compared with that of the desired acoustic surface waves.

5. A method as claimed in claim 2 in which the piezoelectric substance, the acoustic surface wave propagation plane $x_1$ $x_2$ and the acoustic surface wave propagation axis $x_1$ are selected so that the particle displacement of one of said shear axial-bulk-waves is substantially parallel to said acoustic surface wave propagation surface and at right angles to the direction of $x_1$, and the reduced piezoelectric coefficients $d_{16}$ and $d_{36}$ are substantially zero.

6. A method as claimed in claim 5 in which said piezoelectric substance comprises a piezoelectric cubic crystal oriented so that the acoustic surface wave propagation surface lies parallel to the (110) lattice plane or a crystallographically equivalent plane as herein defined, and said propagation direction is oriented parallel to the [001] direction or to a corresponding equivalent direction in a said crystallographically equivalent plane.

7. A method as claimed in claim 1 wherein the piezoelectric substance, the acoustic surface wave propagation plane $x_1$ $x_2$ and the acoustic surface wave propagation axis $x_1$ are selected so that the particle displacement of one of said shear axial-bulk-waves is substantially parallel to said acoustic surface wave propagation surface and at right angles to the direction of $x_1$, and the reduced piezoelectric coefficients $d_{16}$ and $d_{36}$ are substantially zero.

8. A method as claimed in claim 7 wherein said piezoelectric substance comprises a piezoelectric cubic crystal arranged so that the acoustic surface wave propagation surface lies parallel to the (100) lattice plane or a crystallographically equivalent plane as herein defined and said acoustic surface wave propagation direction is oriented parallel to the [011] or [011] direction or to a corresponding equivalent direction in a said crystallographically equivalent plane.

9. An acoustic surface wave device comprising a monocrystalline body of a piezoelectric substance having an acoustic surface wave propagation surface formed thereon, respective launching and receiving interdigital electrode arrays applied to the propagation surface respectively to launch and to receive acoustic surface waves along a predetermined propagation axis on said surface so as to provide a desired amplitude-frequency response, and means for attenuating bulk waves directed away from said acoustic surface wave propagation surface, said piezoelectric substance and the orientation of said respective acoustic surface wave propagation surface and axial direction relative to the crystallographic axes of said monocrystalline body being selected to provide substantially zero piezoelectric coupling between said interdigital electrode arrays and at least one of the group of axial-bulk-waves including the longitudinal axial-bulk-wave and that one of the two shear axial-bulk-waves which has substantially no component of particle motion at right-angles to said acoustic surface wave propagation surface, the piezoelectric coupling between a respective interdigital electrode array and the axial-bulk-waves which are generated thereby being small enough to prevent a significant disturbance of the desired amplitude - frequency response of the device.

10. A device as claimed in claim 9 in which the piezoelectric substance, the acoustic surface wave propagation surface represented by coordinates $x_1$ $x_2$ and the acoustic surface wave propagation axis represented by the direction of the coordinate $x_1$ are selected so that $$d_{11} + \tfrac{1}{2} d_{16} \tan \phi = 0$$

and $$d_{31} + \tfrac{1}{2} d_{36} \tan \phi = 0$$

where $\phi$ is the angle, measured in the plane $x_1 x_2$, that the generated particle motion of said longitudinal axial-bulk-wave would make with said $x_1$ direction, and $d_{11}$, $d_{31}$, $d_{16}$ and $d_{36}$ are respective piezoelectric constants, using reduced indices, which relate to the surface $x_1 x_2$.

11. A device as claimed in claim 10 in which both said shear axial-bulk-waves are generated by said interdigital electrode array, the crystallographic orientation being such that the direction of particle movement for each shear axial-bulk-wave is inclined at an angle of at least 5° to the acoustic surface wave propagation surface, and the receiving transducer is spaced from the launching transducer in the direction of propagation of acoustic surface waves so that the effect at said receiving transducer of said shear axial-bulk-waves generated by said launching transducer are negligible compared with that of the desired acoustic surface waves.

12. A device as claimed in claim 11, in which said piezoelectric substance is lithium niobate.

13. A device as claimed in claim 10, in which the piezoelectric substance, the acoustic surface wave propagation plane $x_1 x_2$ and the acoustic surface wave propagation axis $x_1$ are selected so that the particle displacement of one of said shear bulk wave components is substantially parallel to said acoustic surface wave propagation surface and at right angles to the direction of $x_1$, and the reduced piezoelectric coefficients $d_{16}$ and $d_{36}$ are substantially zero.

14. A device as claimed in claim 13 wherein said piezoelectric substance comprises a piezoelectric cubic crystal oriented so that the acoustic surface wave propagation surface lies parallel to the (110) lattice plane or a crystallographically - equivalent plane, as herein defined, and said propagation direction is oriented parallel to the [001] direction or a corresponding equivalent direction in a crystallographically equivalent plane.

15. A device as claimed in claim 9, in which the piezoelectric substance, the acoustic surface wave propagation plane $x_1 x_2$ and the acoustic surface wave propagation axis $x_1$ are selected so that the particle displacement of one of said shear bulk wave components is substantially parallel to said acoustic surface wave propagation surface and at right angles to the direction of $x_1$, and the reduced piezoelectric coefficients $d_{16}$ and $d_{36}$ are substantially zero, $d_{16}$ and $d_{36}$ being piezoelectric constants, using reduced indices, which relate to the surface $x_1, x_2$, and wherein said piezoelectric substance comprises a piezoelectric cubic crystal arranged so that the acoustic surface wave propagation surface lies parallel to the (100) lattice plane or a crystallographically - equivalent plane, as herein defined, and said acoustic surface wave propagation direction is oriented parallel to the [011] or [01̄1] direction or to a corresponding equivalent direction in a said crystallographically - equivalent plane.

16. A device as claimed in claim 9, in which said piezoelectric substance comprises bismuth silicon oxide.

17. A device as claimed in claim 9, in which said piezoelectric substance is bismuth germanium oxide.

* * * * *

UNITED STATES PATENT AND TRADEMARK OFFICE
CERTIFICATE OF CORRECTION

PATENT NO. : 3,983,515
DATED : September 28, 1976
INVENTOR(S) : Richard Frank Mitchell et al It is certified that error appears in the above-identified patent and that said Letters Patent are hereby corrected as shown below:

col. 4, line 63, cancel "(1$\bar{1}$0), ($\bar{1}\bar{1}$0)" and insert -- ($\bar{1}$10), (1$\bar{1}$0) --;

line 64, cancel "(110)" and insert -- ($\bar{1}\bar{1}$0) --;

col. 5, line 24, cancel "[$\bar{1}$01]" and insert -- [101] --;

line 25, cancel "[101]" and insert -- [$\bar{1}$01] --;

IN THE CLAIMS claim 3, line 14, after "85°" insert -- → --; after "95°" insert -- → --;

Claim 8, line 7, cancel "[011]" (1st occurr.) and insert -- [0$\bar{1}\bar{1}$] --;

claim 15, line 17, cancel "[011]" (1st occurr.) and insert -- [0$\bar{1}\bar{1}$] --;

Signed and Sealed this

Twenty-first Day of December 1976

[SEAL]

Attest:

RUTH C. MASON
*Attesting Officer*

C. MARSHALL DANN
*Commissioner of Patents and Trademarks*